United States Patent [19]
Barraud et al.

[11] 4,235,958
[45] Nov. 25, 1980

[54] PHOTOSENSITIVE FILM USABLE IN MICROGRAVURE

[75] Inventors: André Barraud, Bures-sur-Yvette; Jean Messier, Gif-sur-Yvette; Annie Ruaudel, Chatenay-Malabry, all of France

[73] Assignee: Commissariat a l'Energie Atomique, Paris, France

[21] Appl. No.: 38,072

[22] Filed: May 11, 1979

Related U.S. Application Data

[63] Continuation-in-part of Ser. No. 807,145, Jun. 16, 1977, abandoned.

[30] Foreign Application Priority Data

Jun. 23, 1976 [FR] France .................... 76 19105

[51] Int. Cl.³ .................... G03C 1/68; G03C 5/00
[52] U.S. Cl. .................... 430/281; 204/159.22; 430/271; 430/311; 430/313; 430/321; 428/411
[58] Field of Search .................... 96/115 P, 86 P, 36.2, 96/35.1; 427/43; 430/271, 281, 311, 313, 321; 204/159.22; 428/411

[56] References Cited

U.S. PATENT DOCUMENTS 3,923,761  12/1975  Parker et al. .................... 96/86 P

FOREIGN PATENT DOCUMENTS 1945456  4/1970  Fed. Rep. of Germany .
1275767  5/1972  United Kingdom .

OTHER PUBLICATIONS

Stenhagen, Arkiv for Keni, vol. 1, No. 13, 99-104 (1949).
Avikan et al., IBM Technical Disclosure Bulletin, vol. 14, No. 1, Jun. 1971.
Whitts Microcircut engineering 1979, (Sep. 1979), Aachen Communication II p. 21.
Gaines, Interscience, 1966 Chap. 4, Sect. IV-B pp. 180, 163 and 331.
Adam, The Physics and Chemistry of Surfaces (Dover Publications) 1968, p. 74.
Wunderlick, Molecular Physics, Academic Press (1973), p. 254.

Primary Examiner—Jack P. Brammer
Attorney, Agent, or Firm—Pearne, Gordon, Sessions

[57] ABSTRACT

Photosensitive film which can be used in microgravure, wherein it comprises at least one organic monomolecular layer having amphiphilic molecules with at least one irradiation polymerizable function and one aliphatic chain with at least 12 carbon atoms, a polymerizable function being located at the hydrophobic end of said molecules.

The photosensitive films can be used with particular advantage in the production of microetched objects, such as optical and holographic systems, integrated optical devices and electronic microcircuits.

14 Claims, 1 Drawing Figure

U.S. Patent  Nov. 25, 1980  4,235,958
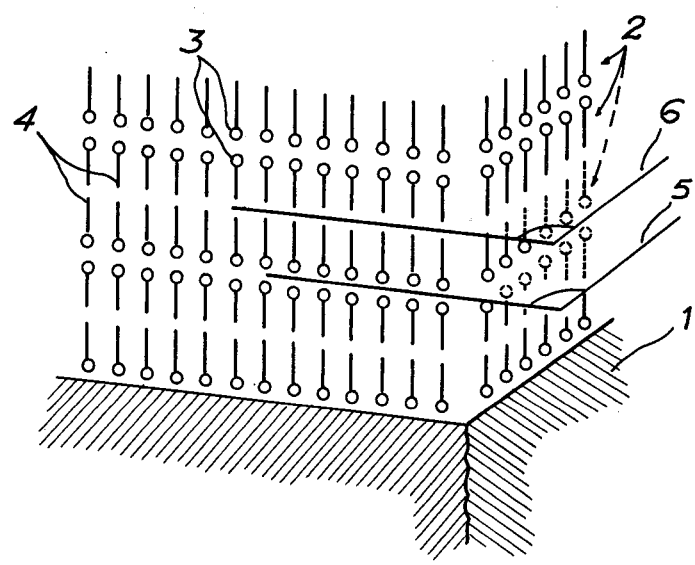

;# PHOTOSENSITIVE FILM USABLE IN MICROGRAVURE

This application is a continuation-in-part of applicants' prior co-pending application Ser. No. 807,145, filed June 16, 1977, now abandoned.

BACKGROUND OF THE INVENTION

The present invention relates to novel photosensitive films which can be used in microgravure.

It is known that in microgravure and particularly in the production of integrated electronic circuits, photosensitive resin layers called photoresists are used in the following manner. On the substrate which it is desired to etch is placed a thin layer of a photoresist and above this a mask comprising a sheet of a material which is not sensitive to irradiation and which is perforated and cut at the points where it is desired to subsequently obtain relief patterns and the whole assembly is exposed to irradiation, for example by ultra-violet irradiation. Thus, those portions of the photoresist which are not protected by the mask are hardened during irradiation. A solvent is then used to eliminate those parts of the photoresist layer which have not been hardened by radiation. The object is then immersed in an etching solution which is specific to the substrate and in this way the desired etchings are obtained. Those parts of the resist layer which have been hardened by irradiation are then eliminated.

More specifically, the present invention relates to photosensitive films constituted by at least one monomolecular layer of organic molecules having an irradiation polymerizable function.

The term photosensitive film is understood to mean a film which is sensitive not only to photons but also to charged or uncharged particulate radiation.

The presently known photosensitive films of this type have the disadvantage of not having satisfactory mechanical characteristics and specifically for use in microgravure, because the successive monomolecular layers from which they are formed do not adhere sufficiently to one another or to the substrate.

BRIEF SUMMARY OF THE INVENTION

The problem of the present invention is to provide a photosensitive film which can be used in microgravure and which obviates the disadvantage indicated hereinbefore due to the special characteristics of the molecules forming the same.

This problem is solved by a photosensitive film which can be used in microgravure comprising at least one organic monomolecular layer having amphiphilic molecules which include a hydrophobic extremity and a hydrophilic extremity and with at least one irradiation polymerizable function and one aliphatic chain with at least 12 carbon atoms, said polymerizable function being located at the hydrophobic extremities of said molecules on the final carbon atom of the aliphatic chain or in the immediate vicinity thereof.

According to the invention, the irradiation polymerizable functions are preferably double bonds or epoxy functions and irradiation is preferably produced by electrons, photons, X-rays or ultra-violet rays.

The photosensitive film according to the invention has in particular the advantage of having very good mechanical properties after irradiation due more particularly to a good adhesion of the first layer to the substrate and the successive monomolecular layers to one another.

Thus, the choice of molecules having a polymerizable function located at the hydrophobic extremities of the molecules, i.e. on the final carbon atom of the aliphatic chain or in the immediate vicinity thereof, makes it possible to establish by irradiation bridges between two adjacent monomolecular layers and to thus firmly bond the said layers to one another, whereas in the absence of polymerizable function they would only be interconnected in a weak manner by van der Waals' interactions.

Moreover, as the polymerizable planes of two successive layers are contiguous, irradiation polymerization takes place under optimum conditions due to the significant density of the polymerizable function. It can also be propagated without excessive steric hindrance, which is not the case with molecules having a polymerizable function in the centre of the aliphatic chain or close to the hydrophilic side because the distance between the carbons to be bonded and the same layer is much greater than the length of the C—C bond.

According to the invention, said monomolecular layers are generally formed from identical molecules.

However, in certain cases, it can be advantageous for at least one of the said monomolecular layers to be formed from different molecules or for certain layers to be formed from a mixture of molecules.

According to an embodiment of the invention, the amphiphilic molecules have a polymerizable function located at the hydrophobic extremities of the molecules, said function being for example constituted by a conjugate or non-conjugate double bond.

As examples of such molecules, reference can be made to ω-tricosenoic acid molecules.

In this case, two successive layers of photosensitive film are also bonded at the hydrophilic planes by the interactions between the permanent dipoles of the hydrophilic groups of the molecules. However, the adhesion between successive layers can be increased at the hydrophilic planes by using molecules having hydrophilic groups which can be bonded together by the bridges established by means of a polycondensation reaction.

Examples of suitable hydrophilic groups are described for example in French Patent No. EN. 75 08798 of 20/3/1975 (amide functions and derivatives). In the same way, adhesion between successive layers can be increased at the hydrophilic planes by ionic bonds using molecules in the form of a polyvalent ion salt, such as a bivalent metal salt, for example ω-tricosenoate of $Ca^{++}$, ω-tricosenoate of $Ba^{++}$, ω-tricosenoate of $Cu^{++}$, ω-tricosenoate of $Cd^{++}$, ω-tricosenoate of $Sr^{++}$, ω-tricosenoate of $Pb^{++}$, and ω-tricosenoates of heavy ions, such as a polyvalent anion amine salt, for example ω-trocosenyl amine sulphate.

The use of certain metal salts and in particular heavy ion salts have proved particularly interesting when the photosensitive film subsequently undergoes irradiation by X-rays, because said film has an increased sensitivity.

According to another embodiment of the invention, said molecules have at least two irradiation polymerizable functions, one of said functions being located at the hydrophobic extremities of the molecules and at least one other at the hydrophilic extremities.

Examples of such molecules are ω-allyl tricosenoate, ω-tricosenyl glycidyl ether, and ω-tricosenyl-2-4 pentadienoate. The use of such molecules is particularly advantageous because after irradiation polymerization the film has no weak point between successive layers because all the layers are firmly connected together by the chemical bonds.

The photosensitive films forming the object of the invention can be used on various different types of substrates such as aluminium, silica, silicon, gallium arsenide and silicon nitride substrates. A film with a thickness of 225 Å ensures a suitable protection for chemical etching permitting the etching of the substrate of the thickness of 1000 Å.

The films according to the invention have this advantage because they are extremely thin, very compact and of strictly constant thickness. Furthermore, in the case of irradiation by electrons or X-rays, the bombardment energy can be low leading to a finer line due to reduced widening by electron diffusion, thus permitting a complete utilization of the spatial resolution of the electron guns and the X-ray masks.

The preparation of the photsensitive film according to the invention is carried out by the known Langmuir-Blodgett method based on a liquid bath or by any equivalent method.

In general, an uneven number of monomolecular layers is deposited on a substrate.

BRIEF DESCRIPTION OF THE DRAWING

The drawing shows a number of monomolecular layer of amphiphitic molecules deposited on a substrate.

DESCRIPTION OF THE DRAWING AND PREFERRED EMBODIMENTS

The attached drawing shows the type of structure which may be obtained. It is possible to see the substrate 1 on which are deposited the various monomolecular layers 2. The molecules constituting these monomolecular layers have a hydrophilic group 3 and an irradiation polymerizable function which, according to the invention, is located at the end of the hydrophobic group 4. The hydrophilic groups 3 are in contact with the substrate and the monomolecular layers are arranged in such a way that there are two hydrophobic groups 4 facing one another and then two hydrophilic groups 3 facing one another. Thus, there are polar planes 5 alternating with polymerization planes 6. Thus, after polymerization, a very stable system is obtained due to the pronounced interaction of the polar groups with one another and the bonds established between the layers at polymerization planes by the formation of polymers. Moreover, the adhesion of the first monomolecular layer determined by the plane of the hydrophilic groups is good and is not disturbed by the polymerization reaction.

It is also possible for this layer to be formed from molecules differing from those of the following layers and especially adapted to the substrate but obviously having a polymerizable function at the hydrophobic end to establish the adhesion with the following layers, for example a first ω-tricosenoic acid layer followed by ω-allyl tricosenoate layers.

In the case of monomolecular layers which are difficult to deposit, it may be advantageous to mix the polymerizable molecules with inert amphiphilic molecules, thus increasing the collapse pressure of the ω-allyl tricosenoate by adding 10% behenic acid thereto.

The photosensitive films according to the invention have a very advantageous application in the production of microetched objects such as optical systems, holographic systems, integrated optical devices, electronic microcircuits, etc. According to this production principle, on a substrate is deposited a film constituted by at least one organic monomolecular layer having amphiphilic molecules with at least one irradiation polymerizable function at the hydrophobic end of said molecules and an aliphatic chain with at least 12 carbon atoms, certain areas of said film undergo irradiation by means of a radiation beam which describes the course of the pattern which it is desired to obtain, those parts of the film which have not been polymerized are eliminated by means of an organic solvent and then the assembly undergoes chemical etching with an agent which is specific to the substrate thus permitting the etching of the areas of said substrate which are not protected.

According to a variant, on a substrate is deposited a film constituted by at least one organic monomolecular layer having amphiphilic molecules with at least two irradiation polymerizable functions and one aliphatic chain with at least 12 carbon atoms, at least one of the said functions being located at the hydrophobic end of the molecules and at least one other being located at the hydrophilic end of the molecules, certain areas of the said film undergoing irradiation by means of a radiation beam which describes the course of the pattern which it is desired to obtain and selective of one of the polymerizable functions, those parts of the film which have not been polymerized are eliminated by means of an organic solvent, then the assembly undergoes radiation for the purpose of polymerizing the other polymerizable functions, after which the assembly undergoes chemical etching which is specific to the substrate, making it possible to etch the areas of said substrate which have not been protected.

The invention will be better understood from reading the following description of several methods of obtaining microetched objects using a photosensitive film according to the invention.

EXAMPLE 1

On the substrate which it is desired to etch are deposited nine monomolecular layers of ω-tricosenoic acid of formula:

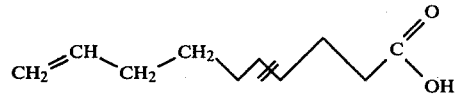

This is performed by the known Langmuir Blodgett method comprising the following stages. ω-tricosenoic acid dissolved in an organic solvent such as chloroform or benzene is spread over the surface of distilled water. Following evaporation of the solvent, the form obtained is compressed at a pressure of 32.5 mN/m and is deposited on a substrate, whilst permitting it to pass through the film by a number of times equal to the number of layers desired. Thus, a stack of monomolecular layers of ω-tricosenoic acid is obtained on the substrate to be etched, whereby each layer has a thickness of 25 Å, giving an overall thickness of 225 Å.

The substrate covered in this way is then placed in front of a programmed electron gun, such as those conventionally used for producing designs or patterns on integrated electronic circuits. The total polymerization of the irradiated areas is obtained for doses of 30 to 40/μ Cb/cm$^2$ at 1.5 keV. The characterisation of the polymer is performed by infrared spectrophotometry by metallic reflection.

The pattern formed during irradiation is then developed by immersing the substrate in a selected solvent of ω-tricosenoic acid, which is for example ethanol, a mixture of water and ethanol or acetone. The ω-tricosenoic acid which has not been polymerized is totally eliminated after immersing for 10 minutes in pure ethanol. The development time can be extended over a period of 30 minutes to an hour without any etching taking place of the polymerized parts.

The actual chemical etching of the substrate is then performed. In the case of an aluminium substrate, a mixture with a phospheric acid base is used at 25° C. and having the following composition: 77% of 85% phosphoric acid, 5% water, 3% fuming nitric acid, 15% glacial acetic acid. The etching speed of the areas of the substrate not protected by the polymerized parts of the monomolecular layer is about 400 Å/mn.

EXAMPLE 2

Deposition takes place on a substrate of 9 layers of ω-calcium tricosenoate.

This is carried out in the same way as in Example 1, but by initially introducing into the distilled water of the Langmuir trough $10^{-3}$ M/l of calcium chloride, by adjusting the pH to 7.5.

The substrate is then placed in front of an electron gun. The total polymerization of the irradiated areas is obtained for a dose of 40 to 50 μCb/cm² at 1.5 keV.

The pattern corresponding to the irradiated areas is then developed by immersing the substrate for a few hours in an acid solution (HCl $10^{-2}$ M/l) in order to replace the Ca++ ions by H+ ions because ω-tricosenoate of Ca++ is insoluble in most organic solvents. It is then immersed for 30 minutes in ethanol.

Etching then takes place in the same way as in Example 1.

EXAMPLE 3

Deposition takes place on a substrate of 9 monomolecular layers of ω-allyl tricosenoate of formula:

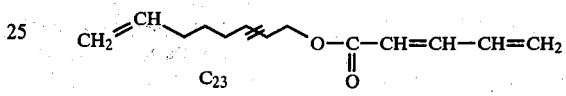

This takes place as in Example 1 by the Langmuir Blodgett method, but the film obtained is compressed at a pressure of 22 mN/m, whereby the thickness of each monomolecular layer is 36 Å. The thus covered substrate is then placed in front of a programmable electron gun at ambient temperature. The total polymerization of the irradiated areas is obtained for a dose of 10 μCb/cm² at 1.5 keV. The pattern corresponding to the irradiated areas is then developed by means of acetone for 15 minutes. This is followed by chemical etching as in Example 1, or if desired etching can be performed by a reactive plasma if a better resolution is desired.

EXAMPLE 4

On a silicon substrate are deposited 5 layers of ω-tricosenyl glycidyl-ether of formula:

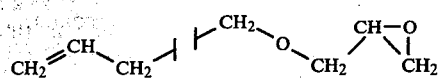

Deposition takes place as in Example 1, but with a compression of 26 mN/m. Each monomolecular layer has a thickness of 35 Å. As the two polymerizable functions are of a different type (vinyl and epoxy) they are polymerized separately. The first undergoes polymerization by ultraviolet radiation through a radiation mask, the pattern corresponding to the irradiated areas then being developed by immersing the substrate in acetone. After which the epoxy function is polymerized by radiation (20 μCb/cm² at 1 KeV for the total polymerization of the epoxy function). The silicon substrate is then etched either by the wet route or by the dry route for example by ionic machining or by reactive plasma.

EXAMPLE 5

This example relates to the deposition of films of 22,23-tricosenyl-2,4-pentadienoate having the formula:

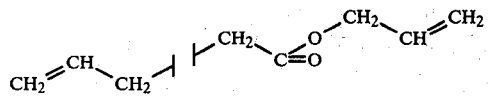

22,23-tricosenyl-2,4-pentadienoate is prepared on the following manner.

ω-tricosenoic acid is converted in ω-tricosenoic alcohol by reduction with AlLiH₄, then ω-tricosenoic alcohol is esterified by 2,4-pentadienoic acid which was obtained by condensation of acrolein with malonic acid, according to the method of DOEBNER.

Analysis of the obtained ester by infra-red spectrometry shows the presence of a conjugated ester function ($v_{C=O}$:1718 and 1170 cm$^{-1}$), and of a butadiene radical ($v_{C=C}$: 1642 and 1597 cm$^{-1}$; $\delta_{CH=CH_2}$: 1008 and 870 cm$^{-1}$). Analysis of this ester by ultraviolet spectrometry in alcohol shows an absorption maximum at λ=248 mμ.

By the Langmuir Blodgett method, a first layer of ω-tricosenoic acid is deposited on a substrate of aluminum, Si—SiO₂ or AsGa, and fourteen layers of 22,23-tricosenyl-2,4-pentadienoate are then deposited on the substrate at a pressure of 22 dynes/cm, thereby to obtain an overall thickness $e_o$ of the layers of about 500 Å.

Areas of the layers deposited on the substrate are polymerized either by preirradiation by means of ultraviolet radiation between 200 and 260 mμ during 30 minutes by using a Mercury lamp of 200 watt followed by irradiation with electrons by means of a programmed electrogun, or only by irradiation with electrons at 5 KeV.

The pattern formed during irradiation is then developed by immersing the substrate in chloroform during a few minutes, at 20° C.

After removal of the unpolymerized monomer, the D50 dose necessary to obtain a polymerized film having a thickness e corresponding to $e_o/2$ after irradiation and removal of the unpolymerized monomer, and the γ contrast corresponding to the slope of the $e/e_o$ curve versus the logarithm of the radiation dose used for polymerization are determined and correspond to γ=1,5, D50=30 μC/cm².

The chemical etching of the substrate is then performed. In the case of an aluminum substrate, a mixture of PO$_4$H$_3$ and NO$_3$H or a CCl$_4$ reactive plasma is used. In the case of SiO$_2$—Si substrate, ammonium fluoride is used. In the case of a AsGa substrate, a mixture of bromine and methyl alcohol is used.

What is claimed is:

1. A photosensitive film which can be used in microgravure, said film comprising at least one organic monomolecular layer having amphiphilic molecules which include a hydrophobic extremity and a hydrophilic extremity and with at least one irradiation polymerizable function and one aliphatic chain with at least 12 carbon atoms, said polymerizable function being located at the hydrophobic extremities of said molecules on the final carbon atom of the aliphatic chain, said film being deposited on a substrate with the hydrophobic extremities of said amphiphilic molecules being primarily located at a first surface of the monomolecular layer and the hydrophilic extremities of said amphiphilic molecules being primarily located at a second surface of the monomolecular layer remote from said first surface thereof.

2. A photosensitive film according to claim 1, wherein said film comprises a plurality of organic monomolecular layers and at least one other of said layers is formed from molecules differing from those of said first mentioned layer.

3. A photosensitive film according to claim 1, wherein said film comprises a plurality of organic monomolecular layers and said layers are formed from identical amphiphilic molecules.

4. A photosensitive film according to claim 1, wherein said film comprises a plurality of organic monomolecular layers and at least one other of said layers is formed by a mixture of molecules.

5. A photosensitive film according to claim 1, wherein the said molecules have at least two irradiation polymerizable functions, at least one of the said functions being located at the hydrophobic extremities of the molecules and at least one other being located at the hydrophilic extremities of the molecules.

6. A photosensitive film according to claim 1, wherein the said amphiphilic molecules are molecules of a polyvalent ion salt.

7. A photosensitive film according to claim 1, wherein said film comprises a plurality of organic monomolecular layers and certain of said layers are interconnected at the hydrophilic extremities of the molecules of said layers by bridges formed between adjacent molecules by polycondensation.

8. A photosensitive film according to claim 1, wherein the polymerizable functions are chosen from the group consisting of double bonds and epoxy functions.

9. A photosensitive film according to claim 1, wherein the said amphiphilic molecules are ω-tricosenoic acid molecules.

10. A photosensitive film according to claim 6, wherein the said amphiphilic molecules are molecules of a ω-tricosenoic acid salt selected from the group consisting of ω-tricosenoate of Ca$^{++}$, ω-tricosenoate of Cu$^{++}$, ω-tricosenoate of Ba$^{++}$, ω-tricosenoate of Cd$^{++}$, ω-tricosenoate of Sr$^{++}$, ω-tricosenoate of Pb$^{++}$ and ω-tricosenoate of heavy ions.

11. A photosensitive film according to claim 5, wherein the said amphiphilic molecules are selected from the group consisting of molecules of ω-allyl tricosenoate, molecules of ω-tricosenyl glycidyl ether, and molecules of ω-tricosenyl-2,4-pentadienoate.

12. A photosensitive film according to claim 1, wherein the irradiation is produced by electrons, photons, X-rays or ultra-violet rays.

13. A process for the production of microetched objects, wherein a photosensitive film according to claim 1 is provided by depositing a plurality of organic monomolecular layers on said substrate to provide an assembly to be microetched, irradiating certain areas of said film by means of a radiation beam which describes the course of the pattern which it is desired to obtain, eliminating by means of an organic solvent those portions of the said film which have not polymerized, and chemically etching the assembly with an agent specific to the substrate, thus permitting the etching of the areas of the said substrate which are not protected.

14. A process for the production of microetched objects, wherein a photosensitive film according to claim 5 is provided by depositing a plurality of organic monomolecular layers on said substrate to provide an assembly to be microetched, irradiating certain areas of said film by means of a radiation beam which describes the course of the pattern which it is desired to obtain and selective of one of said polymerizable functions, eliminating by means of an organic solvent those portions of the said film which have not been polymerized, irradiating the assembly with radiation which polymerizes the other of said polymerizable functions, and chemically etching the assembly with an agent which is specific to the substrate, thus permitting the etching of the areas of said substrate which are not protected.

* * * * *